(12) United States Patent
Lee

(10) Patent No.: US 7,511,404 B2
(45) Date of Patent: Mar. 31, 2009

(54) POWER GENERATOR USING PIEZOELECTRIC MATERIAL

(75) Inventor: Yong-Sung Lee, Hwasung-si (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 11/796,632

(22) Filed: Apr. 27, 2007

(65) Prior Publication Data

US 2008/0136290 A1 Jun. 12, 2008

(30) Foreign Application Priority Data

Dec. 6, 2006 (KR) ...................... 10-2006-0122827

(51) Int. Cl.
*H02N 2/18* (2006.01)

(52) U.S. Cl. .................. 310/339; 310/329; 73/146; 340/442

(58) Field of Classification Search ................. 310/329, 310/331, 339; 290/1 R; 73/146; 340/447, 340/442

See application file for complete search history.

(56) References Cited

U.S. PATENT DOCUMENTS

| 4,521,711 | A | * | 6/1985 | Okamoto et al. | ......... 310/313 B |
| 6,073,321 | A | * | 6/2000 | Kitahara et al. | ............ 29/25.35 |
| 6,194,815 | B1 | * | 2/2001 | Carroll | ....................... 310/339 |
| 6,376,968 | B1 | * | 4/2002 | Taylor et al. | ................ 310/339 |
| 2004/0195937 | A1 | * | 10/2004 | Matsubara et al. | .......... 310/320 |
| 2005/0110277 | A1 | * | 5/2005 | Adamson et al. | ............ 290/1 R |
| 2005/0280334 | A1 | * | 12/2005 | Ott et al. | ...................... 310/339 |

FOREIGN PATENT DOCUMENTS

| JP | 8140369 | 5/1996 |
| JP | 2003209980 | 7/2003 |
| JP | 2006136078 | 5/2006 |

* cited by examiner

*Primary Examiner*—Thomas M Dougherty
*Assistant Examiner*—Bryan P Gordon
(74) *Attorney, Agent, or Firm*—Morgan, Lewis & Bockius LLP

(57) ABSTRACT

A power generator includes a first terminal; a second terminal surrounding the first terminal; piezoelectric elements disposed radially around the terminals, one end of each element being connected to the terminals; and masses connected to the other ends of the elements.

8 Claims, 3 Drawing Sheets

POWER GENERATOR USING PIEZOELECTRIC MATERIAL

CROSS-REFERENCE TO RELATED APPLICATIONS

The present application is based on, and claims priority to, Korean Application Serial Number 10-2006-0122827, filed on Dec. 6, 2006, the disclosure of which is hereby incorporated by reference herein in its entirety.

FIELD OF THE INVENTION

The present invention relates to power generators using a piezoelectric material.

BACKGROUND OF THE INVENTION

The number of electronic parts in vehicles is increasing. The electronic parts are supplied with power from the vehicle battery. Therefore, many electric lines are necessary.

Recently, to reduce the number of electric lines, electronic parts including independent power generators have been provided. Such a power generator uses a piezoelectric material, and should have increased durability and generate a large amount of power using small vibrations.

SUMMARY OF THE INVENTION

Embodiments of the present invention provide a power generator, including a first terminal; a second terminal surrounding the first terminal; piezoelectric elements disposed radially around the terminals, one end of each element being connected to the terminals; and masses connected to the other ends of the elements.

The generator may further include a case, with receivers in which the masses are housed. The receivers restrict movement of the masses when vibration is applied thereto.

The first terminal may be connected to surfaces of the piezoelectric elements that generate a positive voltage, and may supply the positive voltage to an external electronic device. The second terminal may be connected to surfaces of the piezoelectric elements that generate a negative voltage, and may supply the negative voltage to the external electronic device. The terminals may each include a contact surface that is in contact with the external electronic device, and a contact bar that is in contact with the piezoelectric elements. The contact surface may be wider than the contact bar.

The piezoelectric elements may each include several piezoelectric sub-elements, connected in series or in parallel.

The generator may further include a diode that converts a positive/negative AC voltage from the terminals into a positive AC voltage, and a capacitor and a Zener diode that convert the positive AC voltage to a DC voltage. The capacitor may convert the positive AC voltage to a DC voltage in the a range of 0 to 50 V, and the Zener diode may convert the positive AC voltage output to a DC voltage in the range of 0 to 36 V.

BRIEF DESCRIPTION OF THE DRAWINGS

For a better understanding of the nature and objects of the present invention, reference should be made to the following detailed description with the accompanying drawings, in which.

DETAILED DESCRIPTION OF THE PREFERRED EMBODIMENTS

Figure 1A:
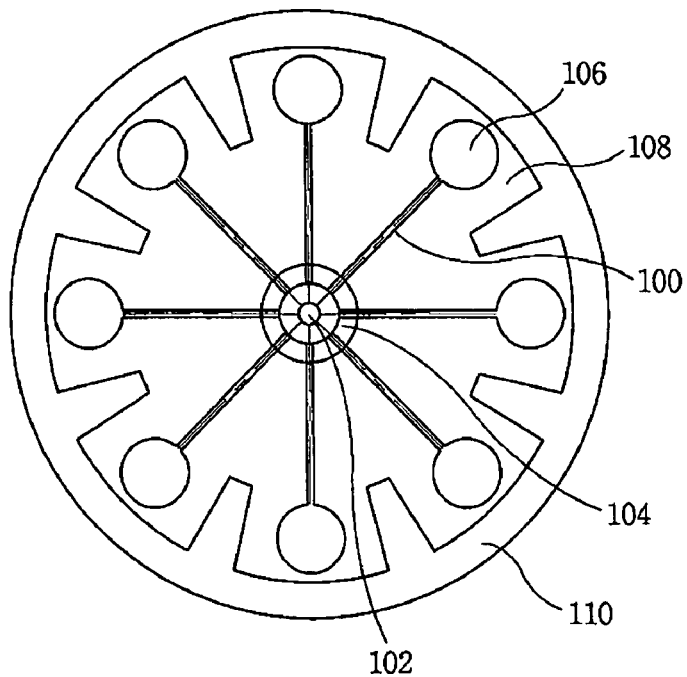
FIG. 1A is a plan view of a power generator using a piezoelectric material according to an embodiment of this invention.
Figure 1B:
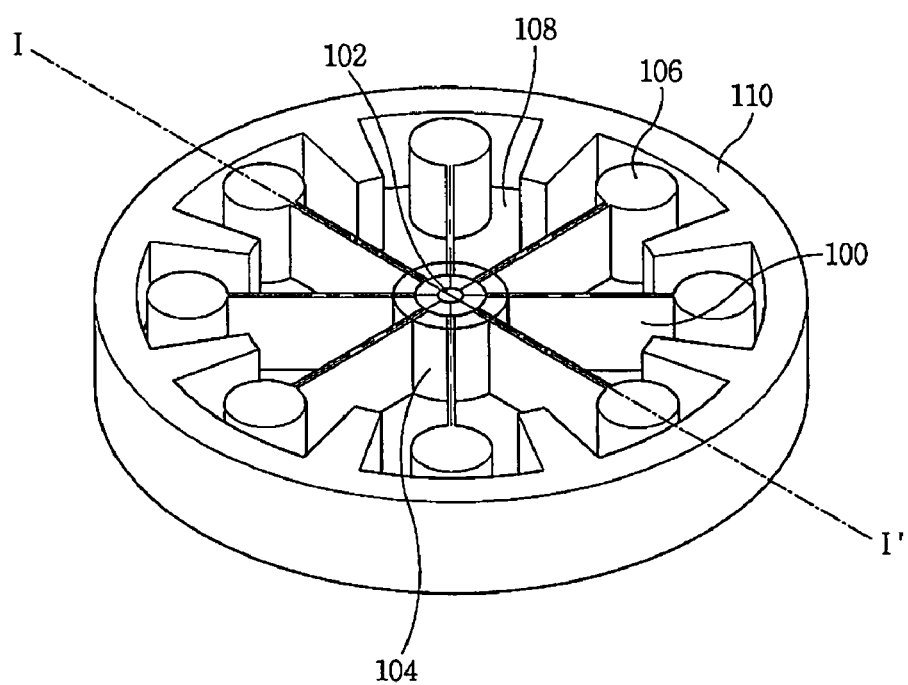
FIG. 1B is a perspective view of the power generator of FIG. 1A.

Referring to FIGS. 1A and 1B, a power generator using the piezoelectric material according to an embodiment of this invention includes an anode terminal 102, a cathode terminal 104 that is disconnected from anode terminal 102 and surrounds anode terminal 102, a plurality of piezoelectric elements 100 extending radially from anode terminal 102 and cathode terminal 104, mass bodies 106 connected to ends of piezoelectric elements 100, and a case 110 having receivers 108 in which mass bodies 106 are received.

Figure 2:
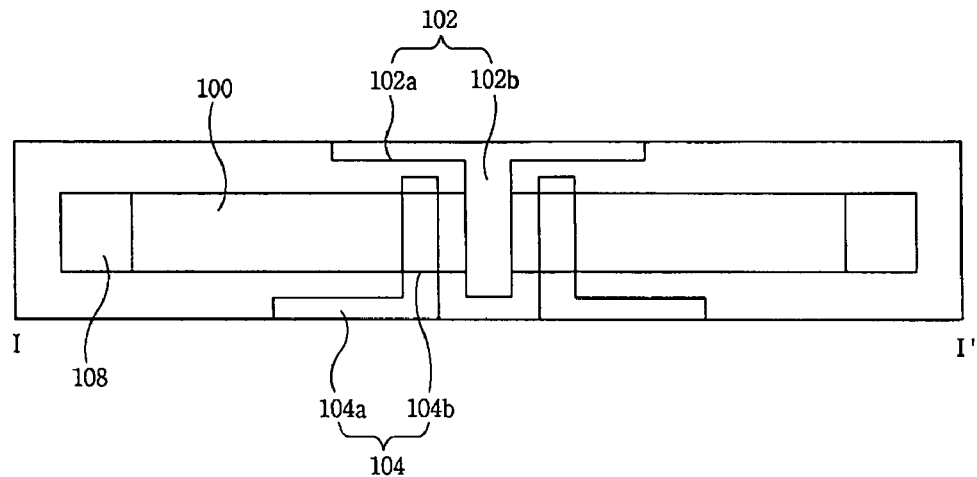
FIG. 2 is a cross-sectional view taken along line I-I' of FIG. 1B.

Anode terminal 102 is connected to surfaces of piezoelectric elements 100 that generate a positive voltage, and is supplied with the positive voltage from piezoelectric elements 100, and supplies the positive voltage to an external electronic device (not shown). Cathode terminal 104 is connected to surfaces of piezoelectric elements 100 that generate a negative voltage, and is supplied with the negative voltage from piezoelectric elements 100, and supplies the negative voltage to the external electronic device (not shown). Referring to FIG. 2, a contact surface 102a of anode terminal 102 is in contact with an anode terminal of the external electronic device, and is wider than a contact bar 102b that is in contact with piezoelectric elements 100, in order to facilitate the connection with the anode terminal of the external electronic device. A contact surface 104a of cathode terminal 104 is in contact with a cathode terminal of the external electronic device, and is wider than a contact bar 104b that is in contact with piezoelectric elements 100, in order to facilitate the connection with the cathode terminal of the external electronic device.

When external vibrations are applied to piezoelectric elements 100, piezoelectric elements 100 deform in all directions from anode terminal 102 and cathode terminal 104 in case 110, and generate power.

Mass bodies 106 move by the external vibration to increase the deformation of piezoelectric elements 100. Receivers 108 restrict the movement of mass bodies 106 to prevent damage to piezoelectric elements 100 due to the large deformation. Because of the mass bodies 106, the power generator generates a large amount of power using small vibrations. Further, the radial arrangement of piezoelectric elements 100 and receiver 108 provide improved durability.

Figure 3A:
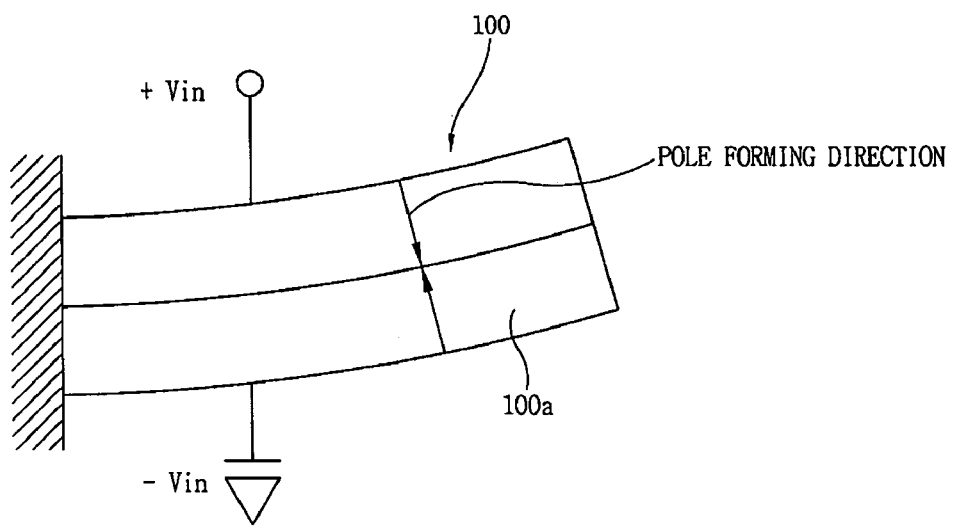
FIG. 3A is a schematic view showing a piezoelectric element in which piezoelectric sub-elements are connected in series.
Figure 3B:
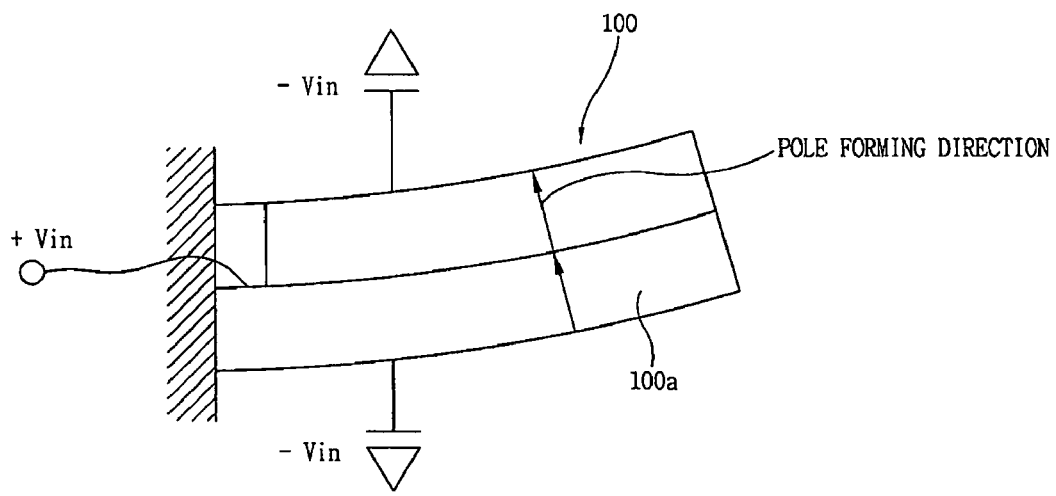
FIG. 3B is a schematic view showing a piezoelectric element in which piezoelectric sub-elements are connected in parallel.

Each piezoelectric element 100 may be configured such that piezoelectric sub-elements 100a are connected in series to each other in a pole forming direction as shown in FIG. 3A or are connected in parallel to each other in the pole forming direction as shown in FIG. 3B. A piezoelectric element 100 (see FIG. 3A) with piezoelectric sub-elements 100a being connected in series generates more power than a piezoelectric element 100 (see FIG. 3B) with piezoelectric sub-elements 100a being connected in parallel. Further, resonance frequency of piezoelectric elements 100 can be adjusted by adjusting the width, thickness, length, etc. of piezoelectric elements 100.

Figure 4:
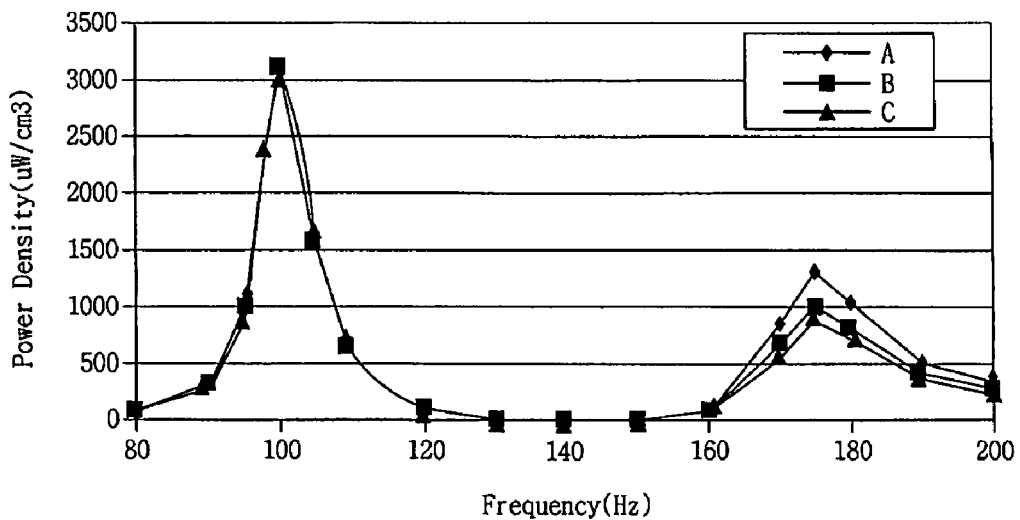
FIG. 4 is a graph illustrating voltage generated by a power generator according to an embodiment of this invention.

FIG. 4 is a graph illustrating a voltage generated from the power generator using four 100 Hz piezoelectric elements and four 180 Hz piezoelectric elements. Referring to FIG. 4, the power generator according to one embodiment of this invention largely resonates at 100 Hz and 180 Hz, and more power is generated at 100 Hz and 180 Hz. It should be understood that when three different load resistors are connected to the power generator, the power supply varies depending on the types of the load resistors.

Figure 5:
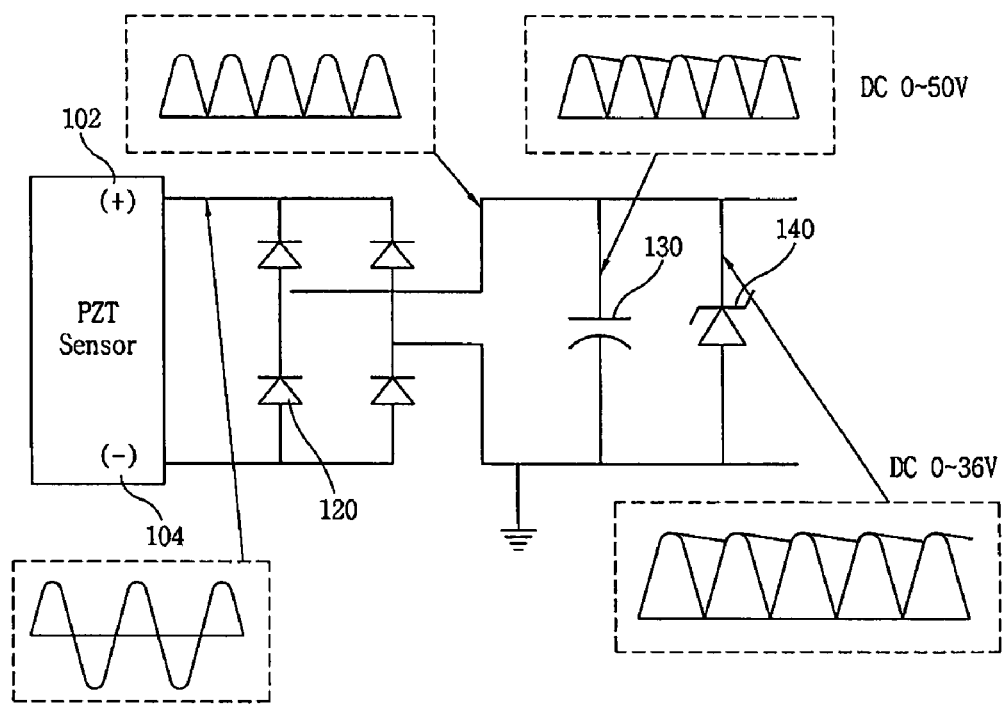
FIG. 5 is a view illustrating an exemplary device for converting an AC voltage, generated by the power generator according to an embodiment of this invention, into a DC voltage.

Referring to FIG. 5, a device for converting AC voltage generated by the power generator into a DC voltage includes a diode 120 that converts positive and negative AC voltage generated from anode terminal 102 and cathode terminal 104 into positive AC voltage, and a capacitor 130 and a Zener diode 140 that convert the positive AC voltage output from diode 120 into DC voltage. Capacitor 130 converts the positive AC voltage output from diode 120 into a DC voltage in the range of 0 to 50 V, and Zener diode 140 converts the positive AC voltage output from diode 120 into a DC voltage in the range of 0 to 36 V.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A power generator, comprising:
   a first terminal;
   a second terminal substantially surrounding the first terminal;
   a plurality of piezoelectric elements, disposed radially around the terminals, each element comprising a first end connected to the terminals;
   a plurality of masses connected to second ends of the elements; and
   an external electronic device;
   wherein the terminals supply voltage from the piezoelectric elements to the external electronic device, and wherein at least one of the terminals comprises a contact surface that is in contact with the external electronic device, and a contact bar that is in contact with the piezoelectric elements; and the contact surface is wider than the contact bar.

2. The power generator as defined in claim 1, further comprising a case, comprising receivers in which the masses are housed.

3. The power generator as defined in claim 2, wherein the receivers restrict movement of the masses when vibration is applied to the masses.

4. The power generator as defined in claim 1, wherein the first terminal is connected to surfaces of the piezoelectric elements that generate a positive voltage, and supplies the positive voltage to the external electronic device, and the second terminal is connected to surfaces of the piezoelectric elements that generate a negative voltage, and supplies the negative voltage to the external electronic device.

5. The power generator as defined in claim 1, wherein the piezoelectric elements each comprise a plurality of piezoelectric sub-elements connected in series.

6. The power generator as defined in claim 1, wherein the piezoelectric elements each comprise a plurality of piezoelectric sub-elements connected in parallel.

7. The power generator as defined in claim 1, further comprising:
   a diode that converts a positive/negative AC voltage from the terminals into a positive AC voltage; and
   a capacitor and a Zener diode that convert the positive AC voltage to a DC voltage.

8. The power generator as defined in claim 7, wherein the capacitor converts the positive AC voltage to a DC voltage in a range of 0 to 50 V, and the Zener diode converts the positive AC voltage output to a DC voltage in a range of 0 to 36 V.

* * * * *